US005771263A

United States Patent [19]
Kanazawa et al.

[11] Patent Number: 5,771,263
[45] Date of Patent: Jun. 23, 1998

[54] COMMUNICATION SYSTEM CONTROL METHOD AND COMMUNICATION SYSTEM USING THE METHOD

[75] Inventors: Masayuki Kanazawa, Kodaira; Yukinari Fujiwara, Musashimurayama, both of Japan

[73] Assignee: Hitachi Denshi Kabushiki Kaisha, Tokyo, Japan

[21] Appl. No.: 778,099

[22] Filed: Jan. 2, 1997

[30] Foreign Application Priority Data

Jan. 8, 1996 [JP] Japan ................................. 8-000424

[51] Int. Cl.$^6$ ...................................................... H04L 5/12
[52] U.S. Cl. ......................... 375/261; 375/269; 375/298; 332/103
[58] Field of Search .................................... 375/235, 260, 375/261, 269, 298, 219, 222; 332/103; 329/304, 306; 37/30; 370/206

[56] References Cited

U.S. PATENT DOCUMENTS

| 3,959,726 | 5/1976 | Hinoshita et al. | 375/293 |
| 4,011,405 | 3/1977 | Ridout et al. | 375/232 |
| 4,700,151 | 10/1987 | Nagata | 332/232 |
| 5,524,286 | 6/1996 | Chiesa et al. | 455/126 |

Primary Examiner—Wellington Chin
Assistant Examiner—Congvan Tran
Attorney, Agent, or Firm—Antonelli, Terry, Stout & Kraus, LLP

[57] ABSTRACT

A communication system having a carrier oscillator for generating a carrier of predetermined frequency, a quadrature modulator for orthogonally modulating the carrier by input baseband I and Q signals and outputting a quadrature modulation wave, and a quadrature demodulator for orthogonally demodulating the quadrature modulation wave using the carrier and outputting demodulation baseband I and Q signals. The phase of the carrier input to the quadrature demodulator is shifted by a predetermined amount in accordance with a phase shift signal. The amplitude of the demodulation baseband I and Q signals output from the quadrature demodulator is corrected on the basis of a control signal, and demodulation baseband I and Q signals thus corrected are output. The amplitude of the input baseband I and Q signals is corrected on the basis of the control signal, and the baseband I and Q signals thus corrected are input to the quadrature modulator. An amplitude error is detected between the amplitude-corrected demodulation baseband I and Q signals. The control signal is generated so that amplitude coincides between the baseband I and Q signals of the quadrature modulation wave coincide and between the demodulation baseband I and Q signals output from the quadrature demodulator on the basis of the detected amplitude error.

8 Claims, 5 Drawing Sheets

COMMUNICATION SYSTEM CONTROL METHOD AND COMMUNICATION SYSTEM USING THE METHOD

BACKGROUND OF THE INVENTION

The present invention relates to a communication system and a method of controlling the communication system, or more in particular to an improvement of amplitude error control of a quadrature modulator and a quadrature demodulator suitable for use with a digital communication system.

In a communication system having a quadrature modulator and a quadrature demodulator, the quadrature modulator develops a disequilibrium between I and Q channels of the quadrature modulation wave output in the process of quadrature modulation of the carrier with two baseband signals including the in-phase signal I (I signal) and quadrature phase signal Q (Q signal). Also, the quadrature demodulator develops a disequilibrium between I and Q channels of the quadrature demodulation wave output in the process of quadrature demodulation of the two baseband signals including the I signal and the Q signal with the carrier. The disequilibrium between I and Q signals causes deterioration of the modulation or demodulation accuracy.

Figure 5:
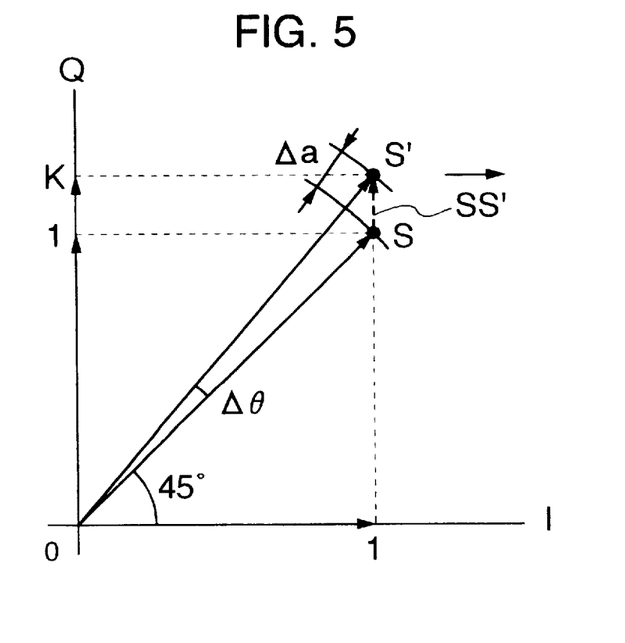
FIG. 5 is a signal vector diagram for explaining the deterioration of modulation accuracy due to the disequilibrium of amplitude.

In the case where the signal amplitude is different between the I signal having level 1 and the Q signal having level K (K is the gain of Q channel with respect to I channel) output from the quadrature modulator or the quadrature demodulator as shown in the vector diagram of FIG. 5, for example, the actual signal point is located at S' against the ideal signal point S. In such a case, the vector error SS', i.e., the phase error $\Delta\theta$ and the magnitude error $\Delta a$ causes the deterioration of modulation accuracy or demodulation accuracy, thereby deteriorating the bit error rate at the receiving end.

In a communication system having a quadrature modulator and a quadrature demodulator developing this disequilibrim between the two baseband signals including I signal and Q signal, therefore, it is necessary to correct the amplitude in the quadrature modulator and the quadrature demodulator to improve the bit error rate at the receiving end.

An example of a conventional quadrature modulator is disclosed, for example, in JP-A-1-317010.

Figure 4:
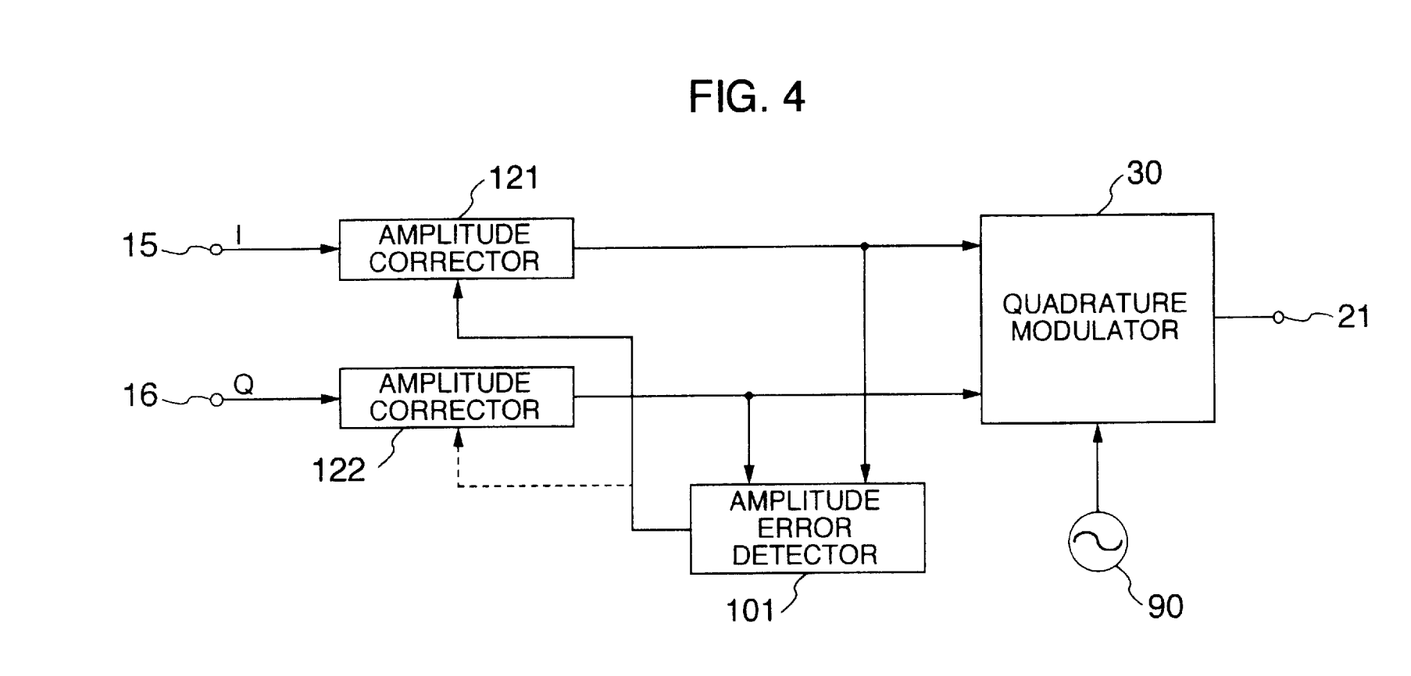
FIG. 4 is a block diagram showing a configuration of component parts of a quadrature modulator used in the conventional method for controlling the amplitude error of the quadrature modulator.

A conventional method of controlling the amplitude error of a quadrature modulator will be explained with reference to FIG. 4.

A baseband I signal input to an input terminal 15 and a baseband Q signal input to an input terminal 16 are applied to a quadrature modulator 30 through amplitude correctors 121 and 122, respectively.

The quadrature modulator 30 is supplied also with a carrier of predetermined frequency oscillated by a carrier oscillator 90.

The quadrature modulator 30 orthogonally modulates the carrier of predetermined frequency input from the carrier oscillator 90 by the baseband I signal and the baseband Q signal input from the amplitude correctors 121 and 122, respectively. A quadrature modulation wave is output to a high-frequency circuit (not shown) through an output terminal 21.

The baseband I signal and the baseband Q signal input to the quadrature modulator 30 are applied to an amplitude error detector 101 for detecting the amplitude error signal.

The amplitude error signal thus detected is applied to the amplitude corrector 121 and/or the amplitude corrector 122. The amplitude corrector 121 and/or the amplitude corrector 122 is controlled in such a manner as to produce a zero amplitude error signal, so that the baseband I signal and the baseband Q signal applied to the quadrature modulator 30 have the same amplitude.

The conventional method of controlling the amplitude error between the baseband I signal and the baseband Q signal demodulated by a quadrature demodulator to have the same amplitude is not described or illustrated herein. The configuration of the conventional method of controlling the amplitude error of the quadrature demodulator, however, is substantially similar to the control method for quadrature modulation, except that the quadrature modulator is replaced by the quadrature demodulator and the quadrature modulation wave is replaced by the quadrature demodulation wave in FIG. 4, with the output signal produced in opposite directions.

In the prior art, although the amplitude error between the baseband I signal and the baseband Q signal before being applied to the quadrature modulator 30 is corrected, the amplitude error developed between the I and Q channels by the quadrature modulator 30 is not corrected. The amplitude error of the quadrature modulation signal output to the signal terminal 21, therefore, contains the amplitude error of the quadrature modulator 30, thereby posing the problem that the amplitude error cannot be reduced to zero for improving the modulation accuracy.

SUMMARY OF THE INVENTION

The object of the present invention is to provide a method of controlling a communication system comprising a quadrature modulator and a quadrature demodulator and also to provide a communication system using the control method, in which the amplitude error between the baseband I signal and baseband Q signal is eliminated and the modulation accuracy is improved thereby to improve the bit error rate at the receiving end.

According to one aspect of the invention, there is provided a communication system comprising a carrier oscillator for generating a carrier of predetermined frequency, a quadrature modulator for orthogonally modulating the carrier with an input baseband in-phase signal I (I signal) and an input baseband quadrature phase signal Q (Q signal) and producing a quadrature modulation signal, and a quadrature demodulator for orthogonally demodulating the quadrature modulation wave by the carrier and producing a demodulation I signal and a demodulation baseband Q signal.

According to another aspect of the invention, there is provided a control method for a communication system, comprising the steps of shifting the phase of the carrier input to the quadrature demodulator by a predetermined amount on the basis of a phase shift signal, correcting the amplitude of the demodulation baseband I signal and the demodulation baseband Q signal output from the quadrature demodulator on the basis of a control signal and producing a demodulation baseband I signal and a demodulation baseband Q signal corrected in amplitude, correcting the amplitude of the input baseband I signal and the input baseband Q signal on the basis of a control signal and applying the baseband I signal and the baseband Q signal corrected in amplitude to the quadrature modulator, detecting the amplitude error between the baseband I signal and the baseband Q signal on the basis of the demodulation baseband I signal and the demodulation baseband Q signal corrected in amplitude, and generating a control signal based on the detected amplitude error in such a manner that the baseband I signal and the baseband Q signal of the quadrature modulation wave output from the quadrature modulator coincide in amplitude with each other and also in such a manner that the demodulation baseband I signal and the demodulation baseband Q signal output from the quadrature demodulator coincide in amplitude with each other. This control method improves the disequilibrium between the baseband I signal and the baseband Q signal output from the quadrature modulator, thereby improving the bit error rate of a receiver.

According to still another aspect of the invention, there is provided a communication system comprising a phase shifter for shifting the phase of the carrier input to a quadrature demodulator by a predetermined amount on the basis of a phase shift signal, a modulation signal amplitude corrector for correcting the amplitude of the input baseband I signal and the input baseband Q signal on the basis of a control signal and applying the baseband I signal and the baseband Q signal corrected in amplitude to the quadrature modulator, a demodulation signal amplitude corrector for correcting the amplitude of the demodulation baseband I signal and the demodulation baseband Q signal output from the quadrature demodulator on the basis of the control signal and outputting a demodulation baseband I signal and a demodulation baseband Q signal corrected in amplitude, an error detector for detecting the amplitude error between the baseband I signal and the baseband Q signal on the basis of the demodulation baseband I signal and the demodulation baseband Q signal corrected in amplitude, and a control means for generating a control signal on the basis of the detected amplitude error in such a manner that the baseband I signal and the baseband Q signal of the quadrature modulation wave output from the quadrature modulator coincide with each other in amplitude and also in such a manner that the demodulation baseband I signal and the demodulation baseband Q signal output from the quadrature demodulator coincide with each other in amplitude.

DESCRIPTION OF THE PREFERRED EMBODIMENTS

A method of controlling the amplitude error of a quadrature modulator and a quadrature demodulator according to a first embodiment of the invention will be explained with reference to FIGS. 1 and 2.

Figure 1:
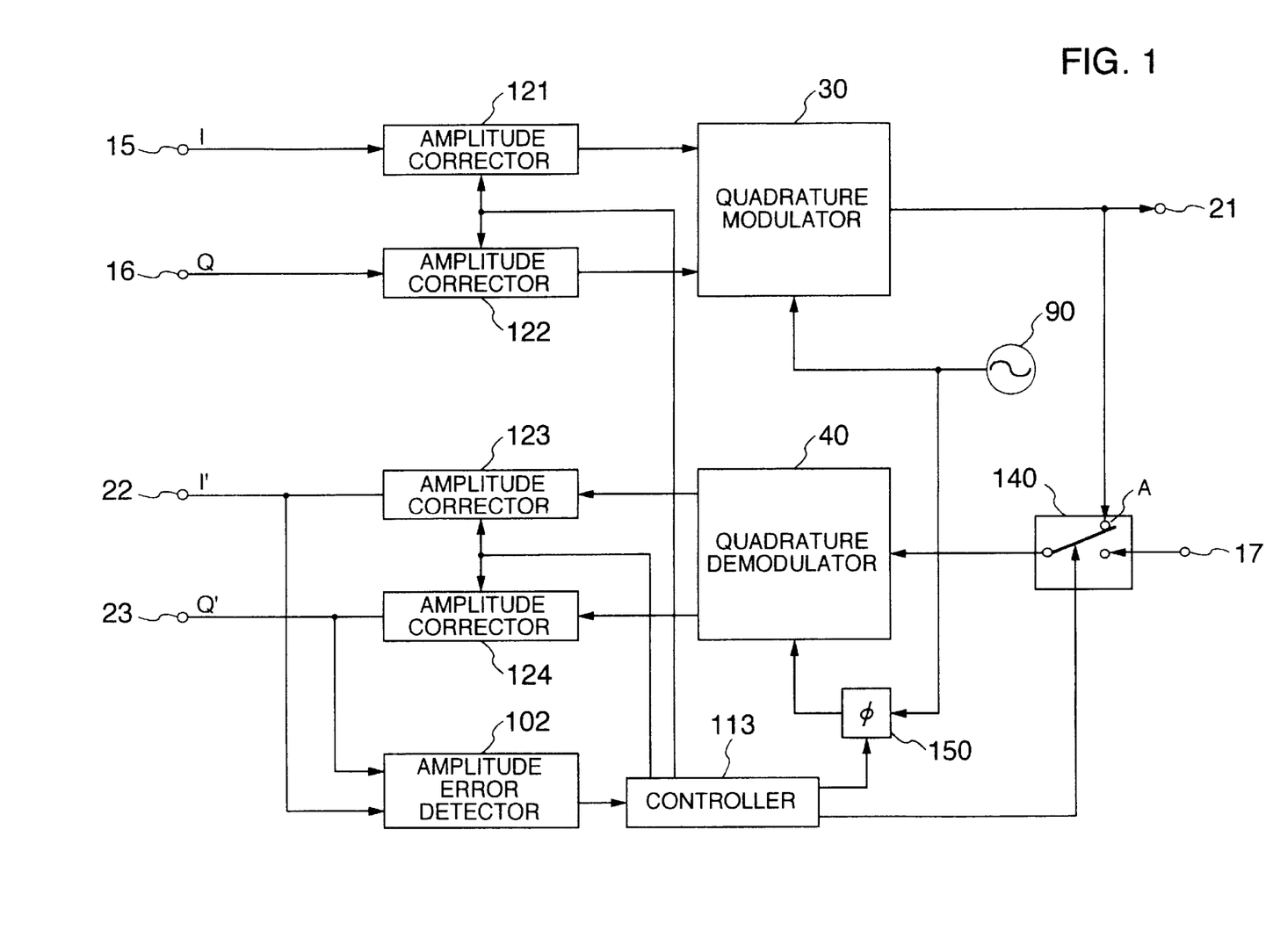
FIG. 1 is a block diagram showing a configuration of component parts of a quadrature modulator and a quadrature demodulator of a communication system for controlling the amplitude error of the quadrature modulator and the quadrature demodulator according to an embodiment of the invention.
Figure 2:
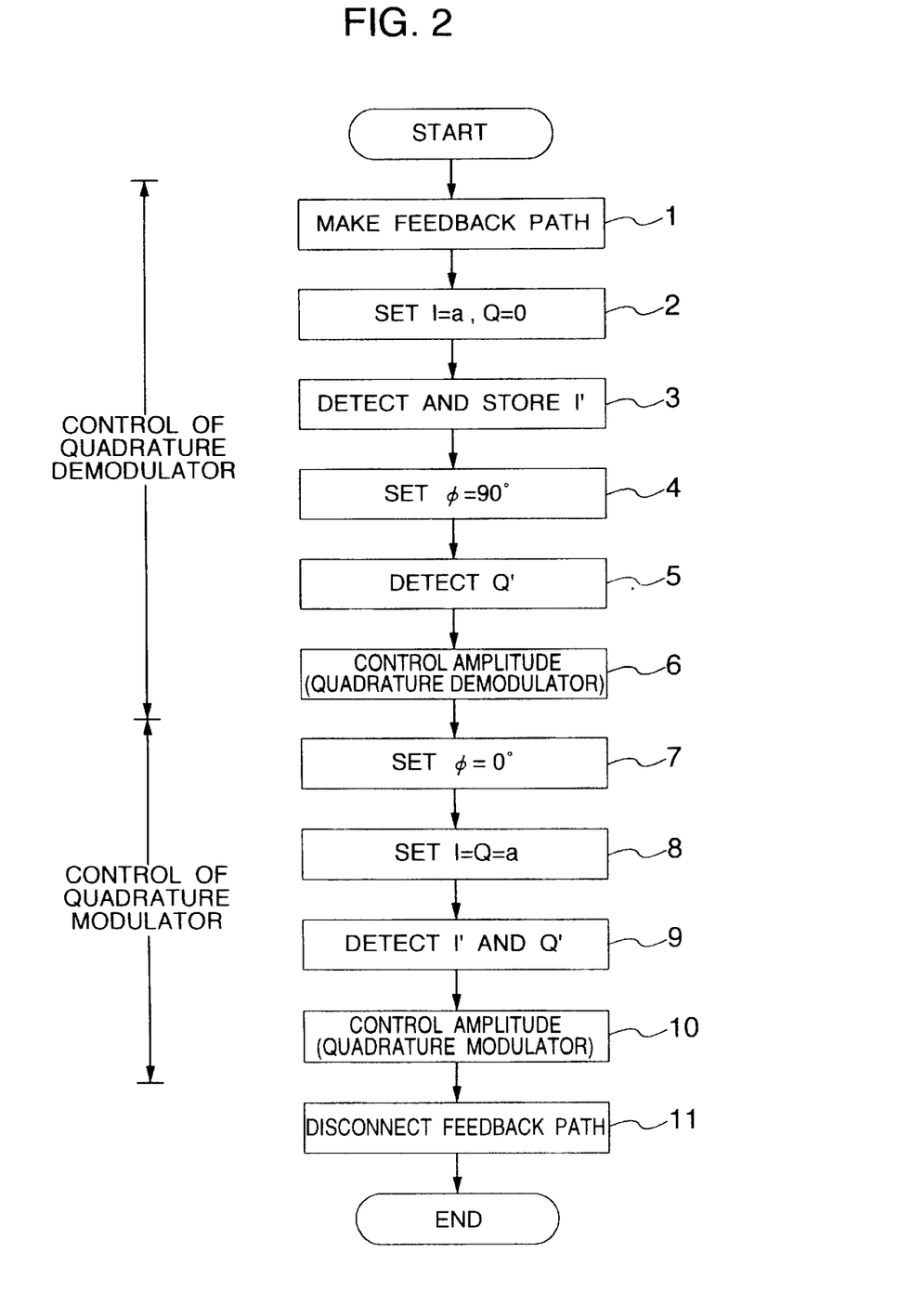
FIG. 2 is a flowchart showing an example of a process for controlling the amplitude error of a quadrature modulator and a quadrature demodulator according to an embodiment of the invention.

FIG. 1 is a block diagram showing component parts of a quadrature modulator and a quadrature demodulator of a communication system in which the amplitude error of the quadrature modulator and the quadrature demodulator is controlled, and FIG. 2 is a flowchart showing an example of the control process of the communication system shown in FIG. 1.

In FIG. 1, reference numeral 15 designates an input terminal for the baseband I signal, numeral 16 an input terminal for a baseband Q signal, numerals 121, 122 modulation signal amplitude correctors for correcting the signal amplitude of the input baseband signals by a control signal, numeral 30 a quadrature modulator for orthogonally modulating the carrier wave by the two baseband signals, numeral 90 a carrier oscillator for oscillating a carrier wave of predetermined frequency, numeral 21 a quadrature modulation wave output terminal, numeral 17 an input terminal for a signal received from another communication system, numeral 140 a demodulator input select switch for selecting the quadrature modulation wave fed back or the receive signal from another communication system, numeral 40 a quadrature demodulator for orthogonally demodulating the signal selected by the switch 140, numerals 123, 124 a demodulation signal amplitude corrector for correcting the signal amplitude of the input baseband signal by a control signal, numeral 150 a phase shifter for shifting the phase of the carrier, numeral 102 an amplitude error detector for detecting the amplitude error between the two demodulation baseband signals, numeral 113 a controller operating on the basis of the amplitude error signal, numeral 22 an output terminal for a demodulation baseband I signal (I'), and numeral 23 an output terminal for a demodulation baseband Q signal (Q').

In this communication system, the baseband I signal is applied to the input terminal 15, and the baseband Q signal is applied to the input terminal 16. The signals input from the input terminals 15 and 16 are applied to the quadrature modulator 30 through the modulation signal amplitude correctors 121 and 122, respectively.

The quadrature modulator 30 orthogonally modulates the carrier of predetermined frequency input from the carrier oscillator 90 by the input baseband I signal and the input baseband Q signal, and outputs a quadrature modulation wave from the quadrature modulation wave output terminal 21 to a high-frequency circuit like a transmission power amplifier, for example.

The quadrature modulation wave output from the quadrature modulator 30, on the other hand, is partly fed back and applied to the demodulator input select switch 140. The signal selected by the demodulator input select switch 140 is applied to the quadrature demodulator 40. The demodulator input select switch 140 is also supplied with a quadrature modulation wave and a receive signal from another communication system (not shown) through the receive signal input terminal 17. The signal applied to the quadrature demodulator 40 is determined by selectively switching the input terminals A and B of the demodulator input select switch 140.

The quadrature demodulator 40 orthogonally demodulates the input quadrature modulation wave or the receive signal by the carrier of predetermined frequency input from the carrier oscillator 90 through the phase shifter 150 thereby to generate a demodulation baseband I signal (I') and a demodulation baseband Q signal (Q'). The baseband I and Q signals thus generated are applied through the demodulation signal amplitude correctors 123, 124, respectively, to the demodulation baseband I signal (I') output terminal 22 and the demodulation baseband Q signal (Q') output terminal 23, respectively.

The amplitude error detector 102 detects the amplitude error between the demodulation baseband I signal (I') and the demodulation baseband Q signal (Q') input thereto and applies an amplitude error signal to the controller 113.

In accordance with the amplitude error signal input thereto, the controller 113 controls using a control signal the modulation signal amplitude correctors 121, 122 for correcting the signal amplitude of the two input baseband signals, the demodulation signal amplitude correctors 123, 124 for correcting the signal amplitude of the two demodulation baseband signals, the demodulator input select switch 140 and the phase shifter 150 for shifting the phase of the carrier.

The controller 113 controls the demodulator input select switch 140 in such a manner that the quadrature modulated wave fed back from the quadrature modulator 30 is applied to the quadrature demodulator 40 during the period when the amplitudes of the I and Q signals are controlled to coincide between the quadrature modulation wave output from the quadrature modulator 30 and the quadrature demodulation wave output from the quadrature demodulator 40. Also, the controller 113 controls the phase shifter 150 in such a manner that the phase of the carrier is shifted by 0 or 90 degrees in order to switch the demodulation output channel when the quadrature modulation wave orthogonally modulated only by a single-channel signal (I signal or Q signal is zero in amplitude) is applied to the quadrature demodulator 40.

Further, an example of the control process according a method of controlling the amplitude error of the quadrature modulator and the quadrature demodulator will be explained with reference to the flowchart of FIG. 2.

In step 1, the controller 113 controls the switch 140 and connects it to a feedback side (contact A) in such a manner that the quadrature modulated wave is fed back and input to the quadrature demodulator 40.

Step 2 sets the amplitude I of the baseband I signal input to the quadrature modulator 30 to a (a is an arbitrary positive number) and the amplitude Q of the baseband Q signal input to the quadrature modulator 30 to 0 thereby to perform quadrature modulation. (As an alternative, the amplitude of the baseband Q signal input to the quadrature modulator 30 may be set to a, and the amplitude of the baseband I signal to 0).

In step 3, the amplitude error detector 102 detects the amplitude of the demodulation baseband I signal (I') demodulated by the quadrature demodulator 40 and output from the amplitude corrector 123, and the amplitude value thus detected is stored in a memory circuit (not shown). In the case where the amplitudes Q and I of the baseband signals input to the quadrature modulator 30 are set to a and 0, respectively, the amplitude of the demodulation baseband Q signal (Q') demodulated by the quadrature demodulator 40 and output from the amplitude corrector 124 is detected by the amplitude error detector 102, and the amplitude value thus detected is stored in a memory circuit.

In step 4, phase shift φ is set to 90 degrees, and the controller 113 controls the phase shifter 150 thereby to shift the phase of the carrier input to the quadrature demodulator 40 by 90 degrees.

In step 5, the amplitude error detector 102 detects the amplitude of the demodulated baseband Q signal (Q') demodulated by the quadrature demodulator 40 and output from the amplitude corrector 124. In the case where the amplitudes Q and I of the baseband signals input to the quadrature modulator 30 are set to a and 0, respectively, the amplitude error detector 102 detects the amplitude of the demodulation baseband I signal (I').

In step 6, the controller 113 generates a signal for controlling the demodulation signal amplitude corrector 123 and/or the demodulation signal amplitude corrector 124 in such a manner that the amplitudes of the I' and Q' signals stored in the memory circuit coincide with each other.

Subsequently, the amplitude control is made in the quadrature modulator 30. In Step 7, the phase shift φ is set to 0° thereby returning the phase of the carrier shifted by 90° in step 4 to 0 degree (initial state).

Step 8 sets and modulates the amplitude of the baseband I signal and baseband Q signal input to the quadrature modulator 30 to I=Q=a.

In step 9, the amplitude error detector 102 detects the amplitude of the demodulation baseband I signal (I') and the demodulation baseband Q signal (Q') demodulated by the quadrature demodulator 40 and output from the amplitude correctors 123, 124, respectively.

In step 10, the controller 113 generates a control signal for controlling the modulation signal amplitude corrector 121 and/or the modulation signal amplitude corrector 122 in such a manner that the I' and Q' signals detected coincide in amplitude with each other.

The foregoing steps completes the control process for amplitude correction of the modulation signal amplitude correctors 121, 122, the quadrature modulator 30, the demodulation signal amplitude correctors 123, 124, and the quadrature demodulator 40. Step 11 connects the switch 140 to the receive signal input terminal 17 (contact B) under the control of the controller 113 in such a manner that the receive signal is applied to the quadrature demodulator 40.

The control process described above makes it possible to set for controlling the amplitude of the I and Q signals for both the quadrature modulator 30 and the quadrature demodulator 40 by a simple configuration and control method in which only the demodulation output of the quadrature demodulator 40 is detected and controlled.

According to this invention, the I and Q signal amplitudes of the modulation output of the quadrature modulator and the demodulation output of the quadrature demodulator can be rendered to coincide with each other by a simple circuit configuration and method. The modulation accuracy of the quadrature modulator and the demodulation accuracy of the quadrature demodulator can thus be further improved for an improved bit error rate at the receiving end.

Figure 3:
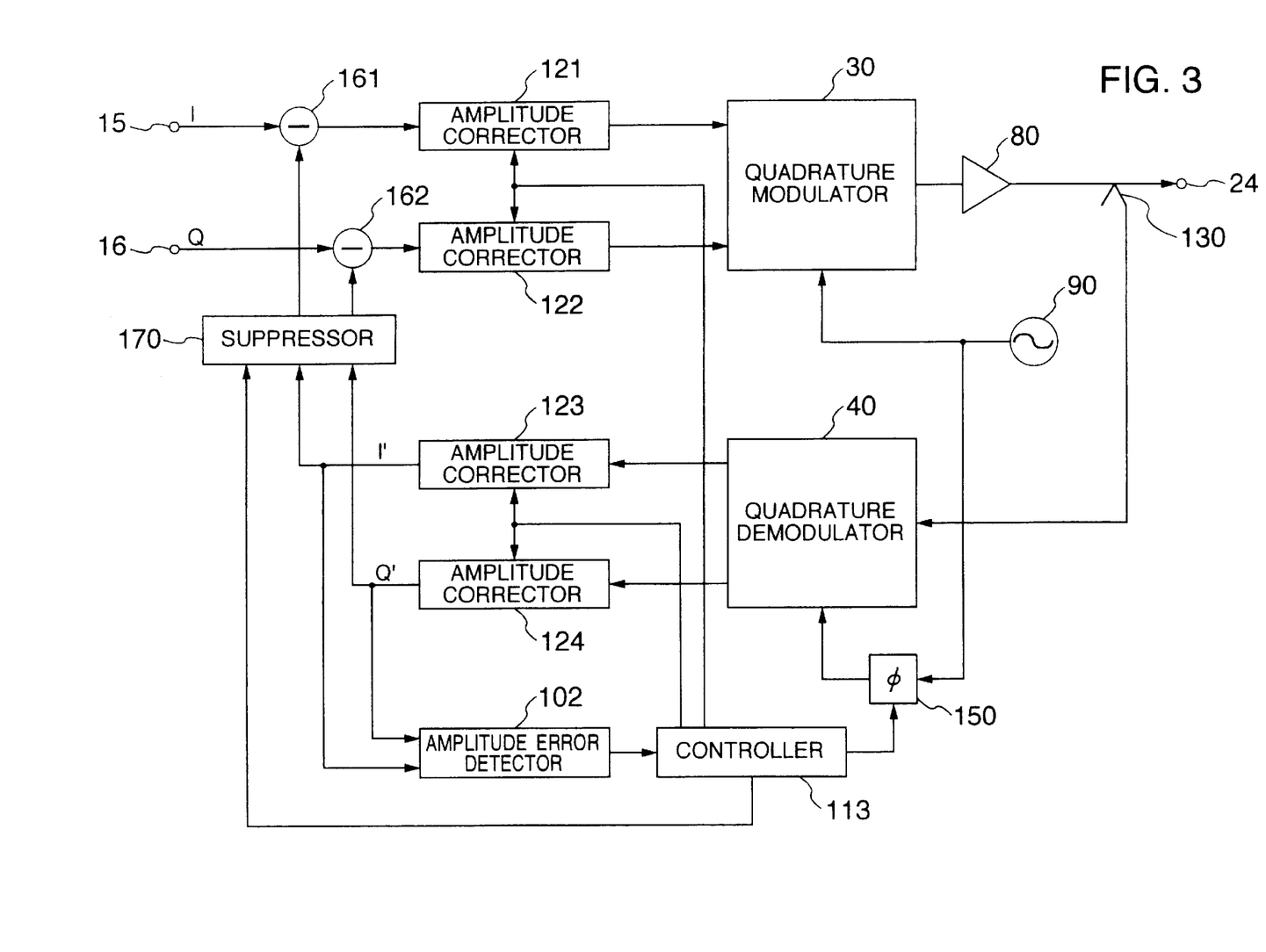
FIG. 3 is a block diagram showing a transmission section of a communication system for controlling the amplitude error of a quadrature modulator and a quadrature demodulator according to another embodiment of the invention.

Now, a second embodiment of the invention will be explained with reference to FIG. 3 showing a method of controlling the amplitude error of the quadrature modulator and the quadrature demodulator in a communication system comprising a transmission section in which the nonlinear distortion of a transmission power amplifier is compensated by feeding back part of the transmission output.

In FIG. 3, numerals 161, 162 designate a subtractor for effecting subtraction between the input baseband I and Q signals and between the demodulation baseband I and Q signals, respectively, numeral 80 a transmission power amplifier for power-amplifying a quadrature modulation wave, numeral 130 a coupler such as a directional coupler for feeding back part of the transmission power, and numeral 170 a suppressor for suppressing the input of the demodulation baseband I and Q signals to the subtractors 161, 162, respectively. In FIG. 3, those component parts identical to the corresponding ones in FIG. 1 are designated by the same reference numerals and will not be described again.

In this communication system, the baseband I signal is input to the input terminal 15, and the baseband Q signal to the input terminal 16. The I and Q signals are then applied to the quadrature modulator 30 through the subtractors 161, 162, and the modulation signal amplitude correctors 121 and 122, respectively.

The quadrature modulator 30 also orthogonally modulates the carrier of predetermined frequency input thereto from the carrier oscillator 90 by the baseband I signal and the baseband Q signal input thereto. The quadrature modulation wave is applied to the transmission power amplifier 80.

The transmission power amplifier 80 power-amplifies the input quadrature modulation wave and outputs an amplified wave as a transmission signal. The power-amplified modulation wave is output from the transmission output terminal 24 to an antenna circuit through the directional coupler 130.

The transmission output produced from the transmission power amplifier 80, on the other hand, is partly fed back through the directional coupler 130 and input to the quadrature demodulator 40.

The quadrature demodulator 40 orthogonally demodulates the demodulation baseband I signal (I') and the demodulation baseband Q signal (Q') by means of the carrier of predetermined frequency input thereto from the carrier oscillator 90 through the phase shifter 150. The signals thus demodulated are applied through the demodulation signal amplitude correctors 123, 124, respectively, to the subtractors 161, 162.

The subtractors 161, 162 subtract the demodulation baseband I signal (I') and the demodulation baseband Q signal (Q') respectively from the input baseband I signal and the baseband Q signal and thereby correct the nonlinear distortion developed in the transmission power amplifier 80. The baseband I and Q signals thus corrected are applied through the modulation signal amplitude correctors 121, 122 to the quadrature modulator 30.

The quadrature modulator 30 orthogonally modulates the carrier of predetermined frequency by the baseband I and Q signals corrected in nonlinear distortion. The quadrature modulation wave having the nonlinear distortion thereof corrected is applied to the transmission power amplifier 80.

The transmission power amplifier 80 power-amplifies the quadrature modulated wave corrected in nonlinear distortion up to a predetermined power level. The transmission output free of the nonlinear distortion of the transmission power amplifier 80 is output to the antenna circuit.

Subsequently, this compensating operation is repeated and the transmission output having the nonlinear distortion thereof compensated is output to the antenna circuit.

As described above, the nonlinear distortion of the transmission power amplifier 80 can be compensated for according to this embodiment.

Now, explanation will be made about the correction of the amplitude error of the quadrature modulator 30 and the quadrature demodulator 40. The amplitude error detector 102 detects an amplitude error from the demodulation baseband I signal (I') and the demodulation baseband Q signal (Q') input thereto, and outputs an amplitude error signal to the controller 113.

In response to the amplitude error signal input thereto, the controller 113 controls the modulation signal amplitude correctors 121, 122 for correcting the signal amplitude of the two input baseband signals, the demodulation signal amplitude correctors 123, 124 for correcting the signal amplitude of the two demodulation baseband signals and the phase shifter 150 for shifting the phase of the carrier.

The controller 113 controls the modulation signal amplitude corrector 121 and/or the modulation signal amplitude corrector 122 in such a manner that the I and Q modulation outputs of the quadrature modulation wave output from the quadrature modulator 30 coincide in amplitude with each other. The controller 113 also controls the demodulation signal amplitude corrector 123 and/or the demodulation signal amplitude corrector 124 in such a manner that the I and Q demodulation outputs of the quadrature demodulation wave output from the quadrature demodulator 40 coincide in amplitude with each other.

Further, the controller 113 controls the phase of the carrier output from the phase shifter 150 in such a manner as to shift by 0 or 90 degrees in order to switch the demodulation output channel when the quadrature modulation wave orthogonally modulated only by a single-channel signal (with I or Q signal at zero level) is input to the quadrature demodulator 40.

A circuit configuration similar to the one shown in FIG. 1 is obtained and the control method according to the invention can be used directly by means of the controller 113 for controlling the suppressor 170 which suppresses the feedback signal input to a feed-forward path during the period when the amplitude is controlled as shown in FIG. 3.

According to the present invention, there is provided a method of controlling an amplitude error of a quadrature modulator and a quadrature demodulator of a communication system, wherein an amplitude error signal is detected from the demodulation baseband I and Q signals produced by the demodulating operation of the quadrature demodulator, the control operation is performed on the basis of the amplitude error signal by two amplitude correctors and a quadrature modulator and two amplitude correctors and a quadrature demodulator, and the I and Q signals in the quadrature modulation wave and the quadrature demodulation wave are controlled to the same value, thereby improving the deterioration of the bit error rate at the receiving end.

We claim:

1. A method of controlling a communication system comprising a carrier oscillator for generating a carrier of a predetermined frequency, a quadrature modulator for orthogonally modulating said carrier by a baseband I signal and a baseband Q signal input thereto and outputting a quadrature modulation wave, and a quadrature demodulator for orthogonally demodulating said quadrature modulation wave using said carrier and outputting a demodulation baseband I signal and a demodulation baseband Q signal, said method comprising the steps of:

a) detecting an amplitude error signal between said baseband I signal and said baseband Q signal outputted from said quadrature demodulator;

b) generating a control signal on the basis of said amplitude error signal in such a manner that the baseband I signal and the baseband Q signal outputted from said quadrature modulator coincide in amplitude with each other, and the demodulation I signal and the demodulation Q signal outputted from said quadrature demodulator coincide in amplitude with each other;

c) shifting the phase of the carrier applied to said quadrature demodulator by a predetermined amount on the basis of a phase shift signal produced from said control signal;

d) correcting the amplitude of the demodulation baseband I signal and the demodulation baseband Q signal outputted from said quadrature demodulator on the basis of said control signal and outputting a demodulation baseband I signal and a demodulation baseband Q signal corrected in amplitude; and e) correcting the amplitude of said input baseband I signal and said input baseband Q signal on the basis of said control signal and supplying said quadrature modulator with the baseband I signal and the baseband Q signal corrected in amplitude.

2. A control method according to claim 1, wherein:

said step of correcting the amplitude of the baseband I signal and the baseband Q signal of said quadrature modulator includes the step of setting said input baseband I signal and said baseband Q signal to the same amplitude; and said step of correcting the amplitude of the baseband I signal and the baseband Q signal of said quadrature demodulator includes the step of setting one of said input baseband I signal and said baseband Q signal to amplitude zero and the other amplitude thereof to a predetermined value.

3. A control method according to claim 2, further comprising the step of:

correcting the amplitude of the baseband I signal and said baseband Q signal of said quadrature modulator after correcting the amplitude of the baseband I signal and the baseband Q signal of said quadrature demodulator.

4. A control method according to claim 3, wherein said step of detecting an amplitude error of said quadrature demodulator includes the steps of detecting the amplitude of the baseband signal output from said quadrature demodulator corresponding to that one of said input baseband I signal and said input baseband Q signal which has the amplitude thereof set to a predetermined value, setting the shift amount of said carrier applied to said quadrature demodulator to 90 degrees, detecting the amplitude of that one of the input baseband I signal and the input baseband Q signal output from said quadrature demodulator which has the amplitude thereof set to zero, and generating said control signal in such a manner as to reduce said error in accordance with the difference between said two detected amplitude values; and said step of detecting an amplitude error of said quadrature modulator includes the steps of setting the phase shift amount of said carrier by zero degree, detecting the amplitude of the baseband I signal and the baseband Q signal output from said quadrature demodulator and generating said control signal in such a manner as to reduce the amplitude difference between said two detected baseband signals in accordance with said difference.

5. A control method according to claim 1, wherein the amplitude of the baseband I signal and the baseband Q signal from said quadrature demodulator to said quadrature modulator is suppressed in accordance with said control signal during the period of said steps a, b, c, d and e.

6. A communication system comprising:

a carrier oscillator for generating a carrier of a predetermined frequency;

a quadrature modulator coupled with said carrier oscillator for orthogonally modulating said carrier by the baseband I signal and the baseband Q signal input thereto and outputting a quadrature modulation wave;

a phase shifter for shifting the phase of said carrier from said carrier oscillator;

a quadrature demodulator coupled with said carrier oscillator through said phase shifter for orthogonally demodulating said quadrature modulation wave using said carrier and outputting a demodulation baseband I signal and a demodulation baseband Q signal;

first means coupled with said quadrature modulator for correcting the amplitude of said input baseband I signal and said input baseband Q signal supplied to said quadrature modulator;

second means coupled with said quadrature demodulator for correcting the amplitude of said demodulation baseband I signal and said demodulation baseband Q signal outputted from said quadrature demodulator;

an error detector coupled with said second amplitude correcting means for detecting the amplitude error signal between said baseband I signal and said baseband Q signal from said demodulator; and control means coupled with said error detector for generating said control signal on the basis of said amplitude error signal in such a manner that said baseband I signal and said baseband Q signal of said quadrature modulation wave outputted from said quadrature modulator coincide in amplitude with each other, that the demodulation baseband I signal and the demodulation baseband Q signal outputted from said quadrature demodulator coincide in amplitude with each other, and that the phase of said phase shifter is controlled by said control means.

7. A communication system according to claim 6, wherein:

said first amplitude correcting means includes a first modulation amplitude corrector for correcting the amplitude of said baseband I signal, a second modulation amplitude corrector for correcting the amplitude of said baseband Q signal, and means for setting said input baseband I signal and said input baseband Q signal input to said first and second modulation amplitude correctors to the same amplitude; and said second amplitude correcting means includes a first demodulator amplitude corrector for correcting the amplitude of said baseband I signal, a second demodulation amplitude corrector for correcting the amplitude of the baseband Q signal, and means for setting the amplitude of one of the baseband signals input to said first and second modulation amplitude correctors to zero and the amplitude of the baseband signal input to the other modulation amplitude corrector to a predetermined value.

8. A communication system according to claim 6, further comprising:

signal suppression means for suppressing the amplitude of the baseband I signal and the baseband Q signal from said quadrature demodulator to said quadrature modulator in accordance with the signal output from said control means.

* * * * *